US010439416B2

(12) United States Patent
Su

(10) Patent No.: US 10,439,416 B2
(45) Date of Patent: Oct. 8, 2019

(54) METHOD FOR OUTPUTTING CHARGING CURRENT ACCORDING TO DISPLAYED MEDIA AND POWER AMPLIFIER

(71) Applicant: Guangdong Oppo Mobile Telecommunications Corp., Ltd., Dongguan, Guangdong (CN)

(72) Inventor: Shangding Su, Guangdong (CN)

(73) Assignee: Guangdong Oppo Mobile Telecommunications Corp., Ltd., Dongguan (CN)

(*) Notice: Subject to any disclaimer, the term of this patent is extended or adjusted under 35 U.S.C. 154(b) by 7 days.

(21) Appl. No.: 15/471,487

(22) Filed: Mar. 28, 2017

(65) Prior Publication Data

US 2017/0201111 A1    Jul. 13, 2017

Related U.S. Application Data

(63) Continuation of application No. PCT/CN2016/084745, filed on Jun. 3, 2016.

(30) Foreign Application Priority Data

Jun. 3, 2015 (CN) .......................... 2015 1 0299774

(51) Int. Cl.
    H02J 7/00      (2006.01)
    H03F 3/20     (2006.01)
    H03F 3/181    (2006.01)
(52) U.S. Cl.
    CPC .......... *H02J 7/0068* (2013.01); *H02J 7/0004* (2013.01); *H02J 7/0052* (2013.01); *H02J 7/0054* (2013.01); *H03F 3/181* (2013.01); *H03F 3/20* (2013.01); *H02J 2007/0001* (2013.01); *H02J 2007/0062* (2013.01); *H02J 2007/0096* (2013.01)

(58) Field of Classification Search
    None
    See application file for complete search history.

(56) References Cited

U.S. PATENT DOCUMENTS

2005/0174094 A1*  8/2005 Purdy ................... H02J 7/0052
                                                          320/134
2008/0036426 A1*  2/2008 Kung .................... H02J 7/0031
                                                          320/160
2012/0153891 A1*  6/2012 Yang ..................... H02J 7/0052
                                                          320/107

(Continued)

FOREIGN PATENT DOCUMENTS

CN           1914582 A       2/2007
CN         101399383 A       4/2009
                  (Continued)

Primary Examiner — David V Henze-Gongola
(74) Attorney, Agent, or Firm — Young Basile Hanlon & MacFarlane, P.C.

(57) ABSTRACT

A method for outputting a charging current is provided. When a power amplifier is connected to a device, the power amplifier acquires recognition information from the device. The power amplifier determines the type of the device according to the foregoing recognition information, and selects, according to the type of the device, a current to output. The power amplifier outputs the selected current to the device, in which the current is used to charge the device.

17 Claims, 8 Drawing Sheets

(56) References Cited

U.S. PATENT DOCUMENTS

| | | | |
|---|---|---|---|
| 2014/0292297 A1* | 10/2014 | Jutras | H02M 3/335 323/282 |
| 2015/0004880 A1 | 2/2015 | Hagan | |
| 2015/0048804 A1 | 2/2015 | Toivanen et al. | |
| 2016/0370835 A1* | 12/2016 | Erickson | G06F 1/266 |

FOREIGN PATENT DOCUMENTS

| | | |
|---|---|---|
| CN | 102498634 A | 6/2012 |
| CN | 102931695 A | 2/2013 |
| CN | 102975627 A | 3/2013 |
| CN | 103219770 A | 7/2013 |
| CN | 203056645 U | 7/2013 |
| CN | 103580249 A | 2/2014 |
| CN | 103746421 A | 4/2014 |
| CN | 203734340 U | 7/2014 |
| CN | 104113114 A | 10/2014 |
| CN | 104578276 A | 4/2015 |
| CN | 104578321 A | 4/2015 |
| CN | 104638776 A | 5/2015 |
| CN | 105006853 A | 10/2015 |

\* cited by examiner

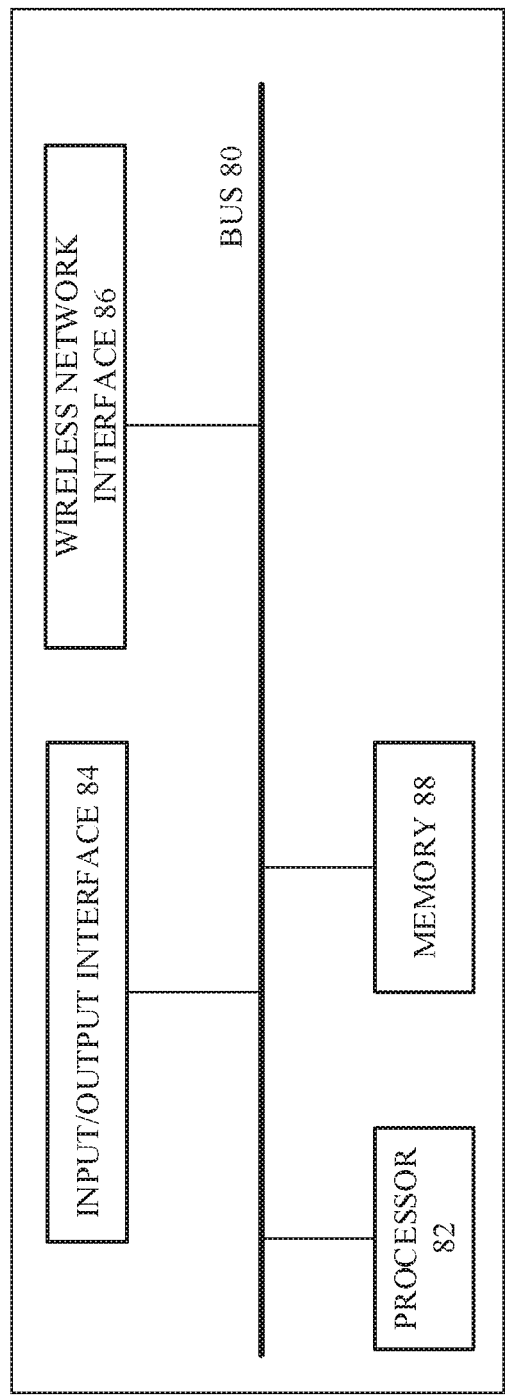

METHOD FOR OUTPUTTING CHARGING CURRENT ACCORDING TO DISPLAYED MEDIA AND POWER AMPLIFIER

CROSS-REFERENCE TO RELATED APPLICATION(S)

This application is a continuation of PCT/CN2014/084745, filed on Jun. 3, 2016, which claims priority to Chinese Patent Application No. 201510299774.3, filed on Jun. 3, 2015, the contents of both of which are herein incorporated by reference in their entireties.

TECHNICAL FIELD

The present disclosure relates to the field of communication devices, and particularly to a method for outputting a charging current and a power amplifier.

BACKGROUND

In mobile phones, tablet PCs, and other portable USB devices, a power adapter or a mobile power supply adopted should use an appropriate mechanism for a Universal Serial Bus (USB) to identify different types of devices, so as to output different currents for different types of devices; for example, a level value or a communication state of a USB communication line D+/D− can be set to achieve the recognition of different devices.

Existing power amplifiers are usually built with a battery, which has the important condition to achieve mobile power function. However, when power is supplied to a USB device by using a power amplifier, improper charging current provided by the power amplifier is easy to lead to problems. For example, the current output capability of the mobile power supply cannot be sufficiently exerted if the current used for charging is small; however, output overload protection may occur if the current used for charging is large, this may lead to a failure in charging or the actual current used for charging is too small.

BRIEF DESCRIPTION OF THE DRAWINGS

In order to more clearly illustrate the technical solutions of the implementations of the present disclosure, the drawings used in the description of the implementations will be briefly described, it will be apparent that the drawings described in the following are implementations of the present disclosure, and it will be apparent to those skilled in the art that other drawings may be obtained from the drawings without any creative efforts.

FIG. 8 is a structure block diagram illustrating the hardware structure of the power amplifier or the device according to the implementation of the present disclosure.

DETAILED DESCRIPTION

In the following, the technical solutions of the implementations of the present disclosure will be described clearly and completely with reference to the accompanying drawings in the implementations of the present disclosure, obviously, the described implementations are a part rather than all of the implementations of the present disclosure. Based on the implementations described herein, all other implementations obtained by those of ordinary skill in the art without creative efforts shall fall within the protective scope of the present disclosure.

A power amplifier adopt in implementing technical schemes of the present disclosure has the capability to identify different devices, and it is possible for the power amplifier to determine different currents for different devices and output corresponding currents to different devices respectively.

Throughout the specification, "power amplifier" used herein is a power amplifier with mobile power function so as to realize the function of supplying power to the above-described device. In addition, "power amplifier" can be a portable headphone amplifier, in order that it is easy to carry and can ensure that it has a good sound quality. "Device" referred to in the implementations can be a mobile phone, a tablet PC, an intelligent game console or other intelligent devices.

Figure 1:
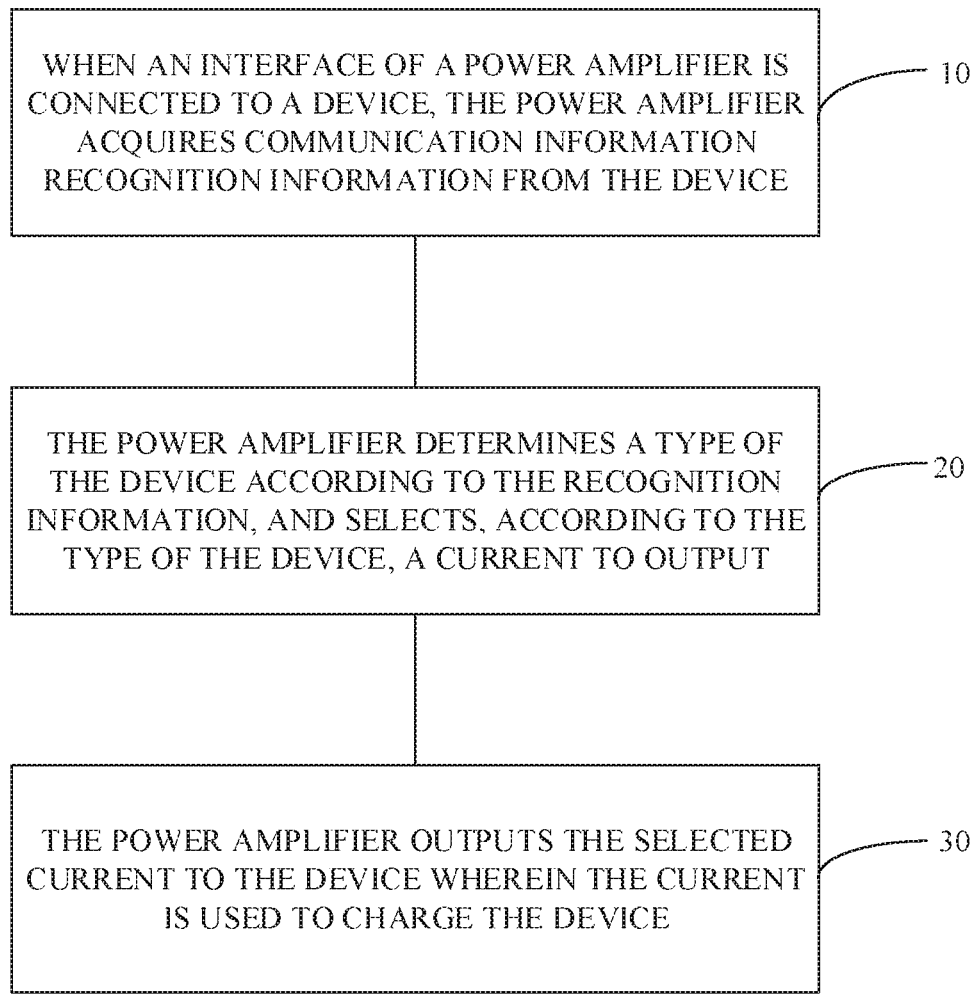
FIG. 1 is a schematic flow chart illustrating a method for outputting a charging current according to an implementation of the present disclosure.

FIG. 1 is a schematic flow chart illustrating a method for outputting a charging current according to an implementation of the present disclosure. Refer to FIG. 1, the method for outputting a charging current is applicable to a power amplifier and can begin at block 10.

At block 10, when a power amplifier is connected with a device, the power amplifier acquires recognition information from the device.

In this implementation, the power amplifier can be connected with the device through a cable, Bluetooth, WiFi, and the like, and the present disclosure is not limited thereto. The method for outputting a charging current and the power amplifier provided in the implementation of the present disclosure will be described in detail with reference to an example in which the power amplifier and the device are connected via a cable.

The device described herein can include mobile phones, tablet PCs, smart game consoles and other intelligent devices, and the present disclosure is not limited thereto.

In the implementation of the present disclosure, the power amplifier includes one or more interfaces; for example, the interface can be a Universal Serial Bus (USB) interface. As an implementation, the power amplifier has one interface, and the interface is a USB interface; the above-mentioned device is plugged and connected to the above-mentioned interface via the cable so as to achieve communication and/or take power. In other implementations, the power adapter can be connected with the device through wireless sensors and other means of connection so as to achieve communication and/or take power. The interface of the power amplifier can also be used to access the device for data transmission.

In some possible implementations, the recognition information referred to herein can include type information of the device; for example, if the device is a mobile phone, the recognition information can be that the mobile phone is an Apple phone or an Android phone.

At block 20, the power amplifier determines the type of the device, and selects a current to output according to the type of the device.

In some possible implementations, the power amplifier can preset trigger information, which can be sent to the device when the power amplifier is connected with the device, so as to trigger the device to output the recognition information to the power amplifier to further facilitate the determination of the type of the device. In an implementation, the trigger information described in this implementation includes: an analog level value, an analog voltage value, an analog power value, or a D+/D− port connection state. The trigger information can be set according to different device so as to improve the applicability of the power amplifier. The above-mentioned trigger information is by way of example only and not exhaustive, the trigger information according to implementations of the present disclosure can include but not limited to the above-mentioned trigger information.

At block 30, the power amplifier output the selected current to the device, and the current is used to charge the device.

In some possible implementations, the power amplifier can output a corresponding current according to currents for different devices so as to charge the different devices, thereby improving the applicability of the power amplifier and improving the charging efficiency. For example, if the device is identified as a first device and the current for the first device is 1 A, the power amplifier can output a current of 1 A to the first device such that the first device can receive the current for charging. For example, if the device is identified as a second device and the current for the second device is 500 mA, the power amplifier can output a current of 500 mA to the second device such that the second device can receive the current for charging, thereby ensuring charging stability.

The triggering information described above is further described herein. When the power amplifier is connected with the device, the power amplifier can send the above-mentioned trigger information to the device, and then identify the type of the device according to the response of the device or the recognition information fed back by the device. For example, the power amplifier sends the above-mentioned trigger information to the device and waits for the response of the device within a preset time such as 30 s or 60 s, if the device responds within the preset time and feeds back the recognition information to the power amplifier, the power amplifier can identify the device to be a device of a first type; the power amplifier can output a corresponding current according to the device of the first type, and the device of the first type can receive the current for charging. In addition, if within the preset time, the device did not respond and did not feed back the recognition information to the power amplifier, the power amplifier cannot identify the device or output current to the device, therefore charging cannot be achieved.

What needs to be explained is, in implementations of the present disclosure, if the above-mentioned device does not need to be charged through the above-mentioned power amplifier, when the power amplifier is connected with the device, it can obtain communication information from the device, among which the communication information includes music information or data information on the device. The music information can further includes: playing music on the device or obtaining music lists on the device, and the data information can further include picture information, video information, or other list information on the device.

By adopting the implementations of the present disclosure, when the power amplifier is used by the device for charging, the power amplifier can obtain the recognition information from the device and determine the type of the device, such that a corresponding current can be output to the device according to the type thereof; the technical schemes of the implementations can provide differentiated currents, improve the efficiency of the power amplifier to charge the equipment, and improve user experience of the power amplifier.

Figure 2:
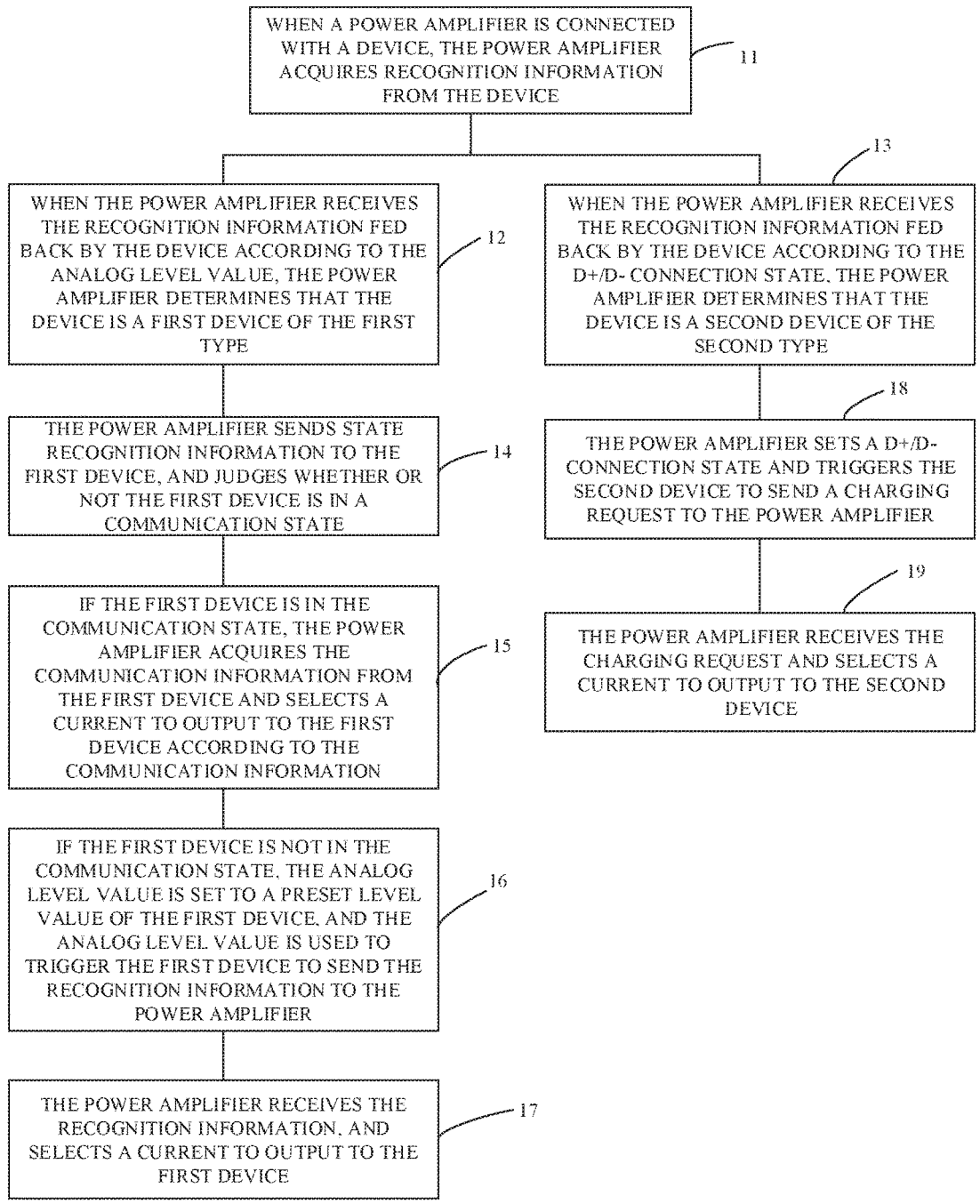
FIG. 2 is a schematic flow chart illustrating a method for outputting a charging current according to an implementation of the present disclosure.

FIG. 2 is a schematic flow chart illustrating a method for outputting a charging current according to a second implementation of the present disclosure. As illustrated in FIG. 2, the method for outputting a charging current according to an implementation of the present disclosure is applicable to a power amplifier and can begin at block 11.

S11, when a power amplifier is connected with a device, the power amplifier acquires recognition information from the device.

The manner in which the power amplifier and the device as described in the implementation of the present disclosure are connected and the concrete realization process of acquiring the recognition information of the device can be found in the implementation described with reference to block 10 of FIG. 1 in the above-described first implementation, and will not repeat here.

As one implementation, before the power amplifier acquires the recognition information from the device, the power amplifier can set trigger information and send the same to the above device, which will be described below.

As an example, the trigger information is an analog level value. The analog level value is used to trigger a device of a first type to feed back the recognition information thereof. In an implementation, the analog level value can be a level value for the device of the first type, for example, the level value for the device of the first type is 2.0V or 2.7V, and the analog level value is 2.0V or 2.7V. The above-described device of the first type receives the analog level value and feeds back the recognition information thereof to the power amplifier, such that the power amplifier can confirm that the device is the device of the first type.

As another example, the trigger information is a D+/D− connection state. The D+/D− connection state is used to trigger a device of a second type to feed back the recognition information thereof. In an implementation, the D+/D− connection state is a connection state that can be recognized by the device of the second type. In order to acquire the recognition information of the device, the power amplifier can set the D+/D− connection state; for example, if the D+/D− connection state is "connected", the device of the second type can receive the connection state and feed back the recognition information thereof to the power amplifier, such that the power amplifier can recognize the device as the device of the second type. If the D+/D− connection state is "not connected", the device of the second type cannot receive the connection state and cannot feed back the recognition information to the power amplifier, and at this time, it is impossible for the power amplifier to recognize the device.

At block 12, when the power amplifier receives the recognition information fed back by the device according to the analog level value, the power amplifier confirms that the device is a device of the first type ("first device" for short).

In some possible implementations, the device receives the analog level value and sends the recognition information to the power amplifier. For example, the above-mentioned recognition information can include current information, communication information, data information, or type information of the device. For example, the device receives the analog level value and sends its own current information to the power amplifier, that is, the device responds to the power amplifier. The power amplifier can receive the current information and recognize the device as the first device.

At block 13, when the power amplifier receives the recognition information fed back by the device according to the D+/D− connection state, the power amplifier determines that the device is a device of the second type ("second device" for short).

In some possible implementations, the device receives the D+/D− connection state and feeds back the recognition information to the power amplifier. The above-mentioned recognition information can include current information, type information, or data information of the device. For example, if the device receives the D+/D− connection state and feeds back the current information thereof to the power amplifier within the response time of the power amplifier, the power amplifier can receive the current information and determine that the device is the second device. The recognition information sent by the device can also be data information such as audio information or picture information, and the present disclosure is not limited thereto.

At block 14, after the process at block 12, the power amplifier sends state recognition information to the first device, and judges whether or not the first device is in a communication state.

In some possible implementations, the state recognition information can be audio information, list information, current information, or data information and so on. For example, the power amplifier sends the audio information to the first device and waits for a response from the first device within a preset time so as to judge whether the first device is in the communication state, that is, whether the power amplifier can acquire communication information from the first device.

At block 15, if the first device is in the communication state, the power amplifier acquires the communication information from the first device and selects a current to output to the first device according to the communication information, among which the communication information includes music information and current information.

In some possible implementations, when the first device is in the communication state, the power amplifier can acquire the communication information from the first device and select the current to output to the first device according to the communication information. The communication information includes music information and current information, and the music information can include playing music on the first device or acquiring music lists on the first device. The current information is information of the current required by the first device, for example, the current to which the first device is adapted. When the power amplifier sends a state recognition request to the first device, if the first device is in the communication state, the first device can respond to the power amplifier within a preset response time of the power amplifier, among which the preset response time can be 30 s or 60 s and so on and the present disclosure is not limited thereto. After the first device responds to the power amplifier, the power amplifier can acquire the communication information of the first device and therefore can know music lists on the first device or play music on the first device; meanwhile, the power amplifier can know the current required by the first device and select a corresponding current to output to the first device, in this way, the power amplifier can charge the first device while communicating.

At block 16, if the first device is not in the communication state, the analog level value is set to a preset level value of the first device, and the analog level value is used to trigger the first device to send the recognition information to the power amplifier.

In some possible implementations, the power amplifier sends a state recognition request to the first device, and if the first device did not respond to the power amplifier within the preset response time of the power amplifier, the power amplifier can determine that the first device is not in the communication state. At this point, since the first device is in a state where no communication is connected, for example, the first device is turned off, it is impossible for the power amplifier to acquire the music lists on the first device or play music; the power amplifier sets a level required by the first device for charging, that is, the analog level value, and sends the analog level value to the first device so as to trigger the first device to send the recognition information to the power amplifier, such that the power amplifier can output a corresponding current to the first device according to the recognition information to charge the first device. For example, the recognition information can include information of current required by the first device.

At block 17, the power amplifier receives the recognition information, and selects a current to output to the first device.

In some possible implementations, the power amplifier can receive the recognition information within a preset time after the recognition information is sent by the first device, among which the preset time can be 5 s, 10 s and so on and the present disclosure is not limited thereto. The power amplifier can determine the current value for the first device according to the recognition information and select a corresponding current to output to the first device so as to charge the first device.

It should be noted that, when the first device is not in the communication state, the power amplifier can receive the recognition information and output a current to the first device, such that the first device can receive the current and enter the communication state, at this point, the power amplifier will not resend the state recognition request to the first device, that is, the power amplifier will not acquire audio information or list information on the first device. If the power amplifier is required to resend the state recognition request to the first device, the first device can be re-connected with the power amplifier after the power amplifier outputs the current to the first device, and at this point, the power amplifier can send the state recognition request to the first device.

At block 18, the power amplifier triggers the second device to send a charging request to the power amplifier based on the D+/D− connection state set in advance.

In some possible implementations, after determining that the device is the second device, the power amplifier can set the D+/D− connection state, send the D+/D− connection state to the second device, and wait for the second device to respond within the preset response time; the preset response time can be 5 s or 10 s and so on, the present disclosure is not limited thereto. The second device receives the D+/D− connection state and sends the charging request to the power amplifier to request for charging. The charging request can be information of current ("current information" for short) required by the second device, for example, the current required by the second device can be 500 mA or 1 A and so on and the present disclosure is not limited thereto.

At block 19, the power amplifier receives the charging request and selects a current to output to the second device.

In some possible implementations, the power amplifier can acquire information of the current required by the second device according to the charging request sent by the second device, and output the current to the second device.

It should be noted that, the power amplifier can output the current to the second device for charging without judging whether the second device is in the communication state; meanwhile, the power amplifier can acquire from the second device data information such as audio information or list information and so on.

By means of the implementations of the present disclosure, when the device takes power by using the power amplifier, the power amplifier can acquire the recognition information from the device and determine the type of the device; in this way, the power amplifier can output a corresponding current to the device according to the type thereof, so that differentiated currents can be provided, efficiency of charging can be improved, and user experience of the power amplifier can be improved.

It should be noted that, although the above-described operations are illustrated in one figure, this does not mean that all of the above operations are necessary for the implementation of the present disclosure or are performed in the order illustrated in the figure; actually, the operations can be implemented in different scenarios separately. For example, the process starts from block 11 to block 17 can be performed separately, and similarly, the process starts from block 11 to block 19 can be performed separately.

Figure 3:
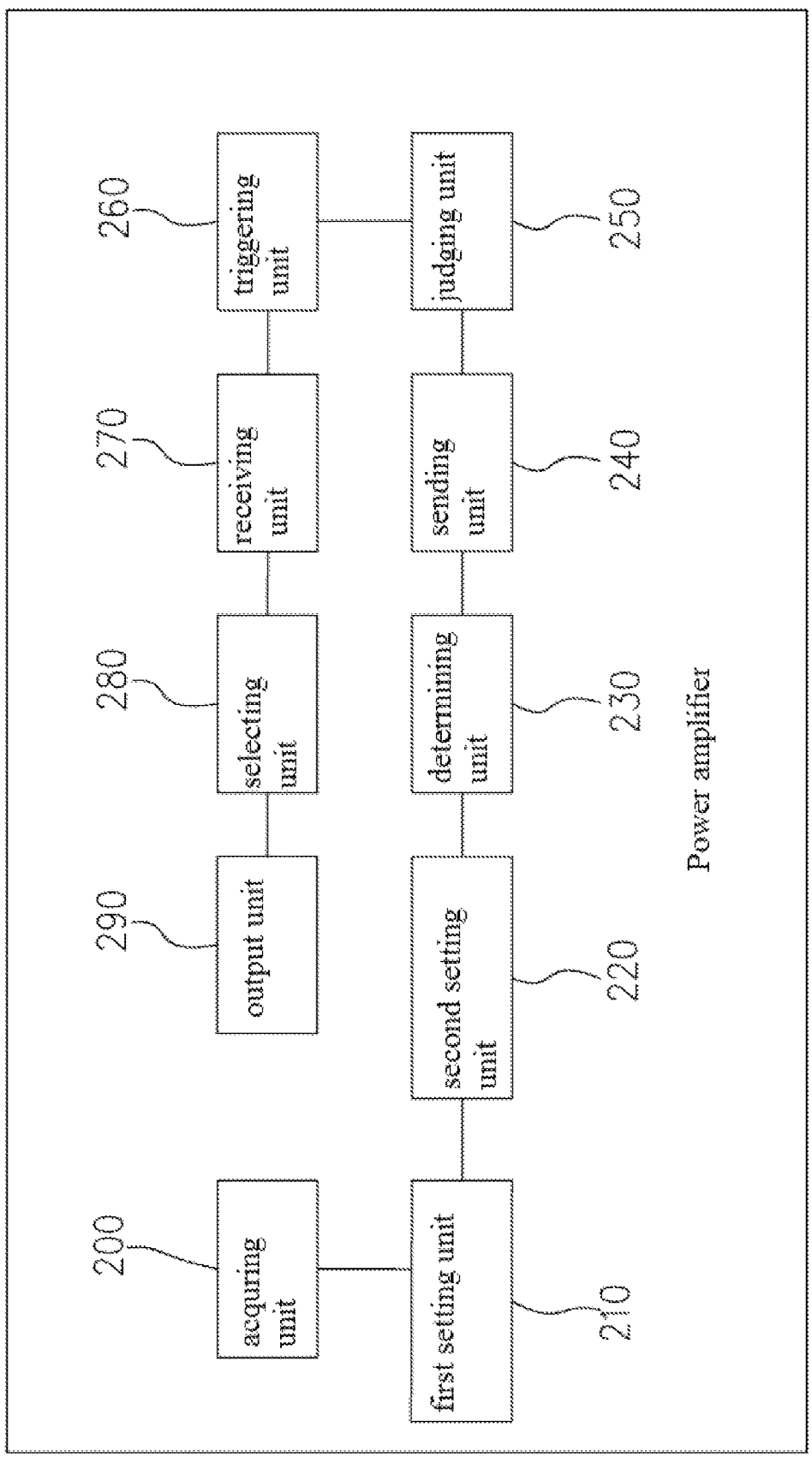
FIG. 3 is a schematic structure diagram illustrating a power amplifier according to an implementation of the present disclosure.
Figure 4:
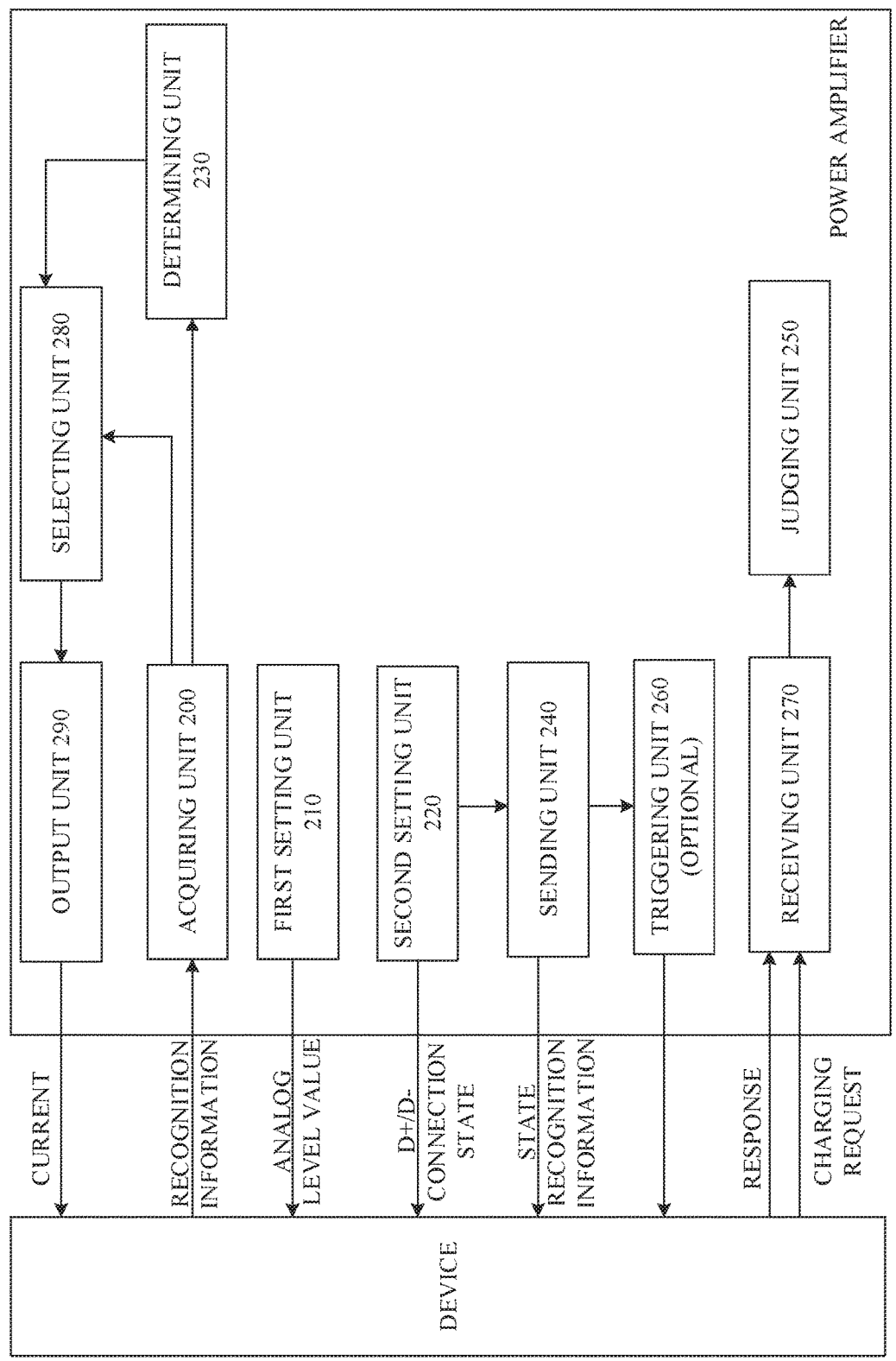
FIG. 4 is a schematic structure diagram illustrating the interaction between the power amplifier and a device according to an implementation of the present disclosure.
Figure 5:
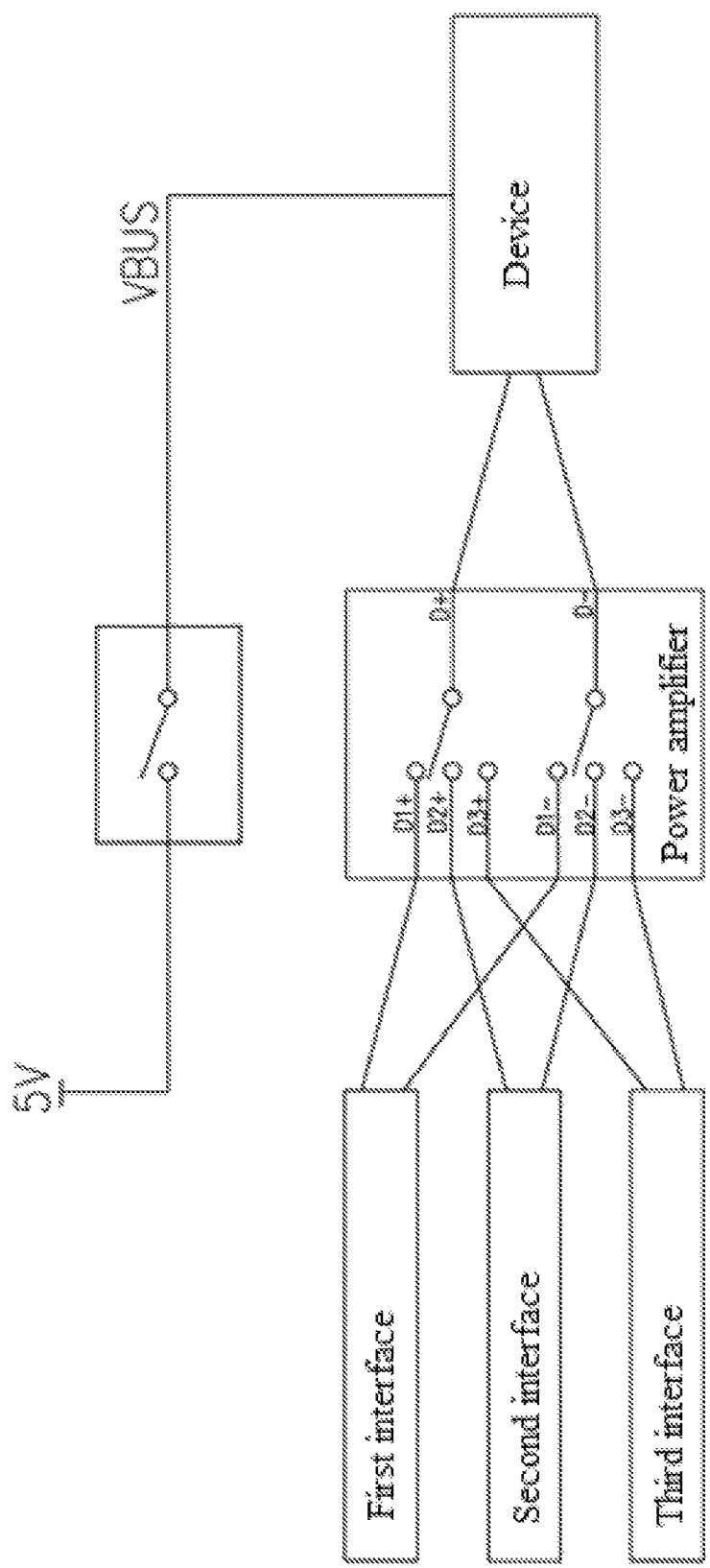
FIG. 5 is a structure block diagram illustrating a device using a power amplifier for charging according to an implementation of the present disclosure.

FIG. 3 is a schematic structure diagram illustrating a power amplifier according to an implementation of the present disclosure. FIG. 4 is a schematic structure diagram illustrating the interaction between the power amplifier and a device according to an implementation of the present disclosure.

With reference to FIGS. 3 and 4, the power amplifier illustrated can include an acquiring unit 200 (for example, a coil, a sensor, and so on), a first setting unit 210 (for example, a logic circuit, a processor, and so on), a second setting unit 220 (for example, a logic circuit, a processor, and so on), a determining unit 230 (for example, a processor), a sending unit 240 (for example, a transmitter), a judging unit 250 (for example, a processor), a triggering unit 260 (for example, a trigger), a receiving unit 270 (for example, a receiver), a selecting unit 280 (for example, a selector), and an output unit 290 (for example, a charging circuit). The power amplifier of this implementation can be adopted to implement the above-mentioned method for outputting charging current.

The acquiring unit 200 is configured to acquire recognition information from a device when the power amplifier is connected with the device.

In some possible implementations, the power amplifier can be connected with the device through a cable, Bluetooth, WiFi, and the like, and the present disclosure is not limited thereto.

Further, the power amplifier can include one or more interfaces; the interface can be a Universal Serial Bus (USB) interface. As an implementation, the power amplifier has one interface, and the interface is a USB interface, the above-mentioned device is plugged and connected to the above-mentioned interface via the cable so as to achieve communication and/or take power. In other implementations, the power adapter can be connected with the device through wireless sensors and other means of connection so as to achieve communication and/or take power. The interface of the power amplifier can also be used to access the device for data transmission.

In some possible implementations, the recognition information referred to herein can include type information of the device; for example, when the device is a mobile phone, the recognition information can be that the mobile phone is an Apple phone or an Android phone.

As an implementation, trigger information can be set in advance, and it can be sent to the device when the power amplifier is connected with the device, so as to trigger the device to carry out recognition and output the recognition information to the power amplifier. In an implementation, the trigger information described in this implementation includes: an analog level value, an analog voltage value, an analog power value, or a D+/D− port connection state. The trigger information can be set according to different devices so as to improve the applicability of the power amplifier. The above-mentioned trigger information is by way of example only and not exhaustive, the trigger information according to implementations of the present disclosure can include but not limited to the above-mentioned trigger information, and the present disclosure is not limited thereto.

For example, the trigger information can be analog level value or D+/D− connection state, which can be set by the first setting unit 210 and the second setting unit 220 respectively. Alternatively, the first setting unit 210 and the second setting unit 220 can be integrated into one component for setting the trigger information.

The first setting unit 210 is configured to set an analog level value and send the analog level value to the device; the analog level value is used to trigger a device of a first type to feed back the recognition information thereof. The analog level value can be the level value required by the device, and the recognition information is the type information of the device.

The second setting unit 220 is configured to set a D+/D− connection state and send the D+/D− connection state to the device; the D+/D− connection state is used to trigger a device of a second type to feed back the recognition information thereof.

In some possible implementations, the D+/D− connection state is a connection state that can be recognized by the device of the second type. In order to acquire the recognition information of the device, the second setting unit 220 can set the D+/D− connection state; for example, if the D+/D− connection state is "connected", the device of the second type can receive the connection state and feed back the recognition information thereof to the power amplifier, such that the power amplifier can recognize the device as the device of the second type. If the D+/D− connection state is "not connected", the device of the second type cannot receive the connection state and cannot feed back the recognition information to the power amplifier, and at this time, it is impossible for the power amplifier to recognize the device.

The determining unit 230 is configured to determine the type of the device according to the recognition information acquired by the acquiring unit 200. The above-mentioned recognition information can include current information, communication information, data information, or type information of the device.

In one implementation, the determining unit 230 is configured to determine that the device is a device of the first type ("first device" for short) if the power amplifier receives the recognition information fed back by the device according to the analog level value. For example, the device receives the analog level value and sends its own current information to the power amplifier, that is, the device responds to the power amplifier. The power amplifier can acquire the current information and determine that the device is the first device.

In another implementation, the determining unit 230 is configured to determine that the device is a device of the second type ("second device" for short) if the power amplifier receives the recognition information fed back by the device according to the D+/D− connection state. For example, the device receives the D+/D− connection state and feeds back its own recognition information to the power amplifier. The above-mentioned recognition information can include current information, type information, or data information of the device. For example, if the device receives the D+/D− connection state and feeds back the current information thereof to the power amplifier within a response time of the power amplifier, the power amplifier can acquire the current information and determine via the determining unit 230 that the device is the second device. The recognition information sent by the device can be data information such as audio information or picture information, the present disclosure is not limited thereto.

The sending unit 240 is configured to send state recognition information to the first device according to the above-mentioned analog level value set by the first setting unit 210.

For example, the sending unit 240 can send the state recognition information to the first device according to the analog level value set by the first setting unit 210, so as to further confirm the state of the first device.

The judging unit 250 is configured to judge whether or not the first device is in a communication state according to the state recognition state sent by the sending unit 240. For example, the state recognition information can be audio information, list information, current information, or data information and so on. For example, if the power amplifier sends the audio information to the first device and waits for a response from the first device within a preset time, the judging unit 250 can judge whether or not the first device is in the communication state, that is, whether or not the power amplifier can acquire (for example, via the acquiring unit 200) the communication information from the first device.

In one implementation, if the first device responds within the present time, the judging unit 250 can judge that the first device is in the communication state, and the power amplifier can acquire communication information from the first device and select (for example, via the selecting unit 280) a current to output to the first device according to the communication information.

When the power amplifier sends the state recognition request to the first device, if the first device is in the communication state, the first device can respond to the power amplifier within a preset response time of the power amplifier; the preset response time can be 30 s or 60 s and so on and the present disclosure is not limited thereto. The above-mentioned communication information includes music information and current information, and the music information can include playing music on the first device or acquiring music lists on the first device. The current information is information of the current required by the first device, for example, the current to which the first device is adapted. As described above, after the first device responds to the power amplifier, the power amplifier can acquire the communication information of the first device and therefore can know the music lists on the first device or play music on the first device; meanwhile, the power amplifier can know the current required by the first device and select a corresponding current to output to the first device, in this way, the power amplifier can charge the first device while communicating.

In addition, in another implementation, after the sending unit 240 sends the state recognition request to the first device, if the first device did not respond thereto within the preset response time, the judging unit 250 can judge that the first device is not in the communication state. At this point, since the first device is in a state where no communication is connected, for example, the first device is turned off, it is impossible for the power amplifier to acquire the music lists on the first device or play music information; the first setting unit 210 sets a level required by the first device for charging, that is, the analog level value, and sends the analog level value to the first device via the sending unit 240 so as to trigger the first device to send the recognition information to the power amplifier, such that the power amplifier can output a corresponding current to the first device according to the recognition information to charge the first device. For example, the recognition information can include current information required by the first device, such as the current required by the first device.

It should be noted that, if the first device is not in the communication state, the power amplifier can receive the recognition information and output a current to the first device, such that the first device can receive the current and enter the communication state, at this point, the power amplifier will not resend the state recognition request to the first device, that is, the power amplifier will not acquire audio information or list information on the first device. If the power amplifier resends the state recognition request to the first device, the first device can be re-connected with the power amplifier after the power amplifier outputs the current to the first device, and at this point, the power amplifier can send the state recognition request to the first device.

The triggering unit 260 is configured to trigger the second device to send a charging request to the power amplifier according to the D+/D− connection state set by the second setting unit 220.

The second device can receive the D+/D− connection state and send the charging request to the power amplifier to request charging upon triggering of the triggering unit 260. The charging request can be current information required by the second device, for example, the current information required by the second device can be 500 mA or 1 A and so on and the present disclosure is not limited thereto. It should be noted that, the triggering unit is optional to the implementation of the technical scheme of the present disclosure. In real practice, the device can send the charging request to the power amplifier after the D+/D− connection state is received on its own initiative.

The receiving unit 270 is configured to receive the charging request sent by the second device.

In some possible implementations, the receiving unit 270 can receive the charging request sent by the second device and acquire the current information thereof, so as to determine the current required by the second device.

In addition, the receiving unit 270 can also be configured to receive the response of the device, which is used by the judging unit 250 to determine the communication state of the first device as described above.

The selecting unit 280 is configured to select a current to output according to the type of the device determined by the determining unit 230.

In some possible implementations, the selecting unit 280 can select the current to which the device is adapted according to the type of the device.

The output unit 290 is configured to output the current selected by the selecting unit 280 to the device for charging.

In practice, as illustrated in FIG. 8, the power amplifier can be provided with a processor 82 (e.g., a hardware processor) to manage, control, or schedule the above mentioned components of the power amplifier. Further, a memory 88 for storing instructions can be provided for the power amplifier, and the hardware processor can carry out the instructions to perform the components.

FIG. 4 is a schematic structure diagram in which the device can use the power amplifier for charging. In this implementation, the power amplifier connects with the device and acquires recognition information from the device so as to determine the type of the device, the power amplifier can output current required by the device according to the type thereof, so as to achieve the purpose of charging for different types of devices. For example, as illustrated in FIG. 4, the power amplifier can adopt a chip integrated with a USB three-pole double-throw switch so as to identify different currents required by different devices for charging. Within the power amplifier is provided with three interfaces, namely, the first interface, the second interface, and the third interface; the three interfaces include three charging mechanisms for devices of different types for charging. It should be noted that, in other implementations, the power amplifier can adopt a chip integrated with a double-pole double-throw switch, such as TPS2514 chip.

The operation of the power amplifier side has been described above; hereinafter, the operation of the device side will be illustrated respectively.

According to another implementation of the present disclosure, it is provided a method for outputting a charging current.

Figure 6:
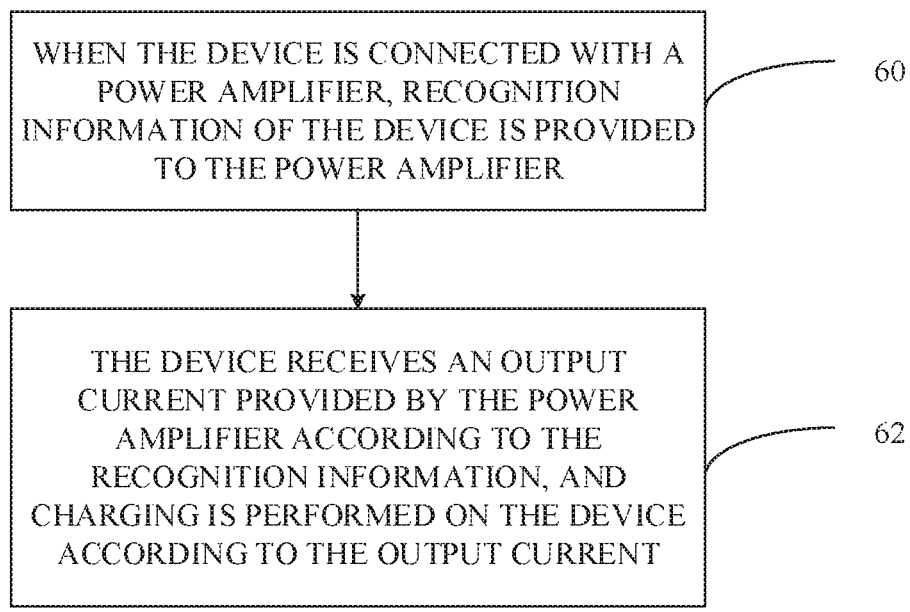
FIG. 6 is a schematic flow chart illustrating a method for outputting a charging current according to an implementation of the present disclosure.

FIG. 6 is a flow chart illustrating the method. As illustrated in FIG. 6, the method for outputting a charging current can be applied to a device and can begins at block 60.

At block 60, when the device is connected with a power amplifier, recognition information of the device is provided to the power amplifier; and at block 62, the device receives an output current provided by the power amplifier according to the recognition information, and charging is performed on the device according to the output current.

Before the recognition information is provided to the power amplifier, the device can receive trigger information from the power amplifier and respond thereto, such that the power amplifier can determine the type of the device.

For example, the trigger information can be an analog level value sent by the power amplifier, and the analog level value is used to trigger a device of a first type ("first device" for short) to feed back the recognition information.

Correspondingly, as an implementation, before the current is received from the power amplifier, the device can receive state recognition information sent from the power amplifier and provide communication information the power amplifier, whereby the power amplifier can select a current to output to the first device according to the communication information.

As another example, the trigger information can be a D+/D− connection state sent by the power amplifier, wherein the D+/D− connection state is used to trigger a device of a second type to feed back the recognition information.

Correspondingly, before the current is received from the power amplifier, the device can receive the D+/D− connection state and send a charging request to the power amplifier, whereby the power amplifier can select a current corresponding to the charging request to output to the second device.

According to another aspect of the present disclosure, it is provided a device, which can use the above-mentioned power amplifier for charging.

Figure 7:
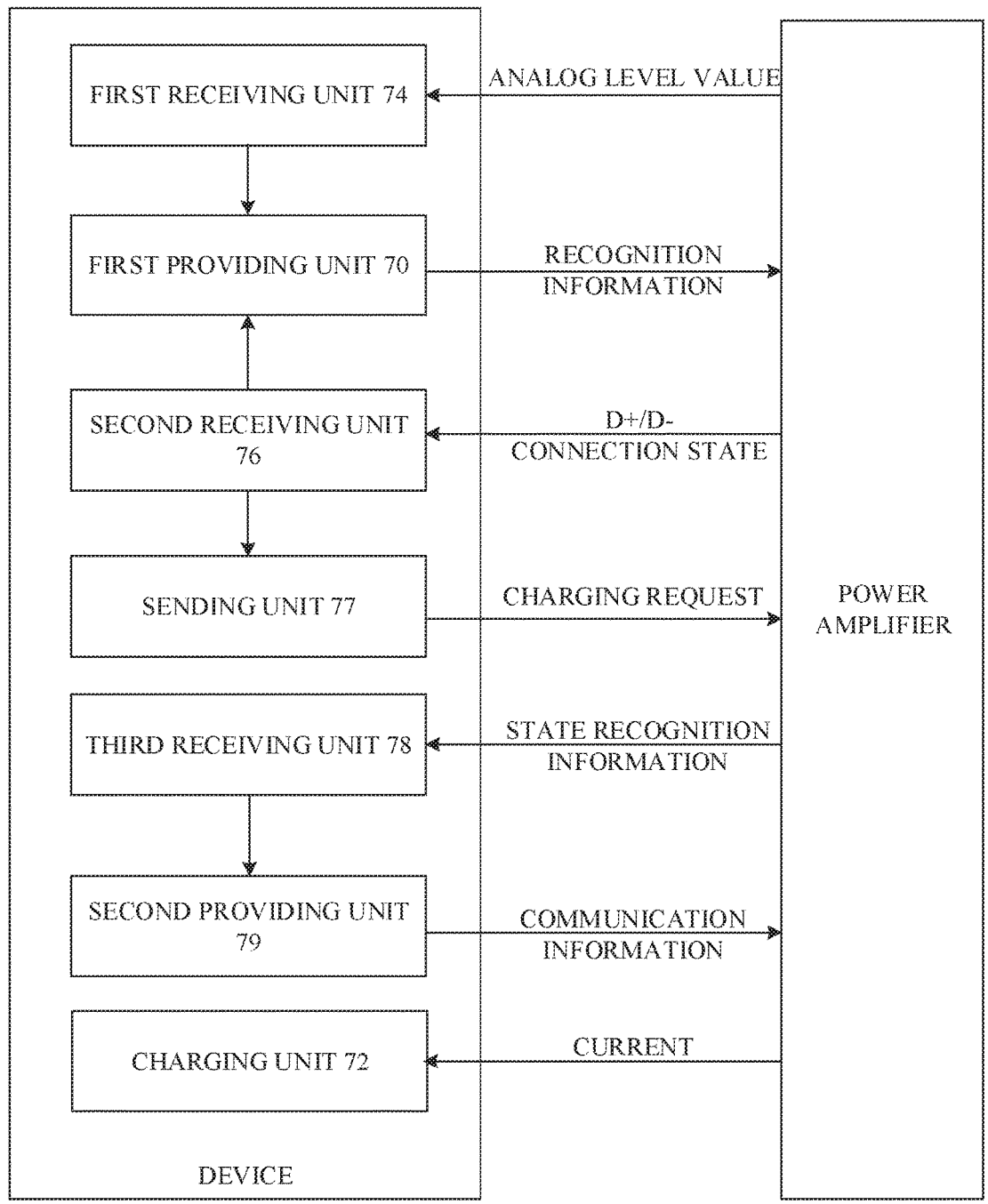
FIG. 7 is schematic structure diagram illustrating a device according to an implementation of the present disclosure.

FIG. 7 is a block diagram illustrating the device. As illustrated in FIG. 7, the device can include: a first providing unit 70 (such as a transmitter), configured to provide recognition information of the device to a power amplifier when the device is connected with the power amplifier; and a charging unit 72 (such as a charging circuit), configured to receive an output current (that is, charging current) provided by the power amplifier according to the recognition information and perform charging according to the output current.

As an implementation, the device can further includes: a first receiving unit 74 (such as a receiver), configured to receive an analog level value sent from the power amplifier before the recognition information of the device is provided to the power amplifier, wherein the analog level value is used to trigger the feedback of the recognition information of a device of a first class ("first device" for short).

As another implementation, the device further includes: a second receiving unit 76 (such as a receiver), configured to receive a D+/D− connection state sent from the power amplifier before the recognition information is provided to the power amplifier, wherein the D+/D− connection state is used to trigger the feedback of the recognition information of a device of a second type ("second device" for short).

As another implementation, the device further includes: a third receiving unit 78 (such as a receiver), configured to receive state recognition information sent from the power amplifier; and a second providing unit 79, configured to provide communication information to the power amplifier, whereby the power amplifier can select a current to output to the first device according to the communication information.

In real practice, the first receiving unit 74, the second receiving unit 76, and the third receiving unit 78 can be integrated into one receiver or a component with reception function, or, they can be arranged separately and independently according to actual needs, the present disclosure is not limited thereto.

As illustrated in FIG. 7, the device can further includes a sending unit 77 (such as a transmitter), configured to send a charging request to the power amplifier if the D+/D− connection state is received by the second receiving unit 76, whereby the power amplifier can select a current corresponding to the charging request to output to the second device.

In practice, as illustrated in FIG. 8, the device can be provided with a processor 82 (e.g., a hardware processor) to manage, control, or schedule the above mentioned components of the power amplifier. Further, a memory 88 for storing instructions can be provided for the power amplifier, and the processor 82 can carry out the instructions to perform the components. In addition, the power amplifier or the device can further includes an input/output interface 84 for communication with external equipment and a wireless network interface 86 for accessing a network. The processor 82, the memory 88, the input/output interface 84, and the wireless network interface 86 can be interconnected via a BUS 80.

By adopting the implementations of the present disclosure, when a device uses a power amplifier for charging, the power amplifier can acquire recognition information from the device and determine the type of the device, so as to output a corresponding current to the device according to the type of the device, so that differentiated currents are provided, efficiency of charging the device by the power amplifier can be improved, and user experience of the power amplifier can be improved.

While the present disclosure has been described in detail above with reference to the exemplary implementations, the scope of the present disclosure is not limited thereto. As will occur to those skilled in the art, the present disclosure is susceptible to various modifications and changes without departing from the spirit and principle of the present disclosure. Therefore, the scope of the present disclosure should be determined by the scope of the claims.

What is claimed is:

1. A method for outputting a charging current for a power amplifier, comprising:
   acquiring recognition information from a device when connected with the device;
   determining a type of the device according to the recognition information, and selecting a current to output according to the type of the device,
   wherein selecting a current to output according to the type of the device comprises:
   sending state recognition information to the device;
   subsequent to the sending the state recognition information to the device, judging whether the device is in a communication state; and
   acquiring communication information from the device if the device is in the communication state, and selecting a current to output to the device according to the communication information,
   wherein the communication information comprises music lists,
   picture information, or video information displayed on the device; and
   outputting the selected current for the device to charge the device.

2. The method of claim 1, further comprising:
   before acquiring the recognition information from the device, setting an analog level value and sending the analog level value to the device, wherein the analog level value is configured to trigger a device of a first type to feed back the recognition information.

3. The method of claim 2, wherein determining the type of the device according to the recognition information comprises:
   determining that the device is a device of the first type when the recognition information fed back by the device according to the analog level value is received.

4. The method of claim 1, further comprising:
   setting the analog level value to a preset level value of the device when the device is not in the communication state.

5. The method of claim 1, wherein determining whether the device is in the communication state comprises:
   determining that the device is in the communication state when the device responds within a preset response time.

6. The method of claim 1, further comprising:
   before acquiring the recognition information from the device, setting a D+/D− connection state and sending the D+/D− connection state to the device, wherein the D+/D− connection state is configured to trigger a device of a second type to feedback the recognition information.

7. The method of claim 6, wherein determining the type of the device according to the recognition information comprises:
   determining that the device is a device of the second type when the recognition information fed back by the device according to the D+/D− connection state is received.

8. The method of claim 7, wherein selecting the current to output according to the type of the device by the power amplifier further comprises:
   triggering a second device to send a charging request to the power amplifier according to the D+/D− connection state; and
   receiving the charging request and selecting a current corresponding to the charging request to output to the device.

9. A power amplifier, comprising:
   at least one processor;
   a memory storing instructions, and the processor is configured to invoke the instructions to:
   acquire recognition information from a device when the power amplifier is connected with the device;
   determine a type of the device according to the recognition information acquired;
   send state recognition information to the device according to an analog level value;
   judge whether the device is in a communication state according to the state recognition information; and
   acquire communication information from the device if the device is in the communication state, and select a current to output according to the communication information,
   wherein the communication information comprises music lists,
   picture information, or video information displayed on the device.

10. The power amplifier of claim 9, wherein the processor is further configured to invoke the instructions to:
    set the analog level value and send the analog level value to the device, wherein the analog level value is configured to trigger a device of a first type to feed back the recognition information.

11. The power amplifier of claim 10, wherein the instructions to determine the type of the device according to the recognition information acquired further comprise instructions to:
    determine that the device is a device of the first type when the recognition information fed back by the device according to the analog level value is received.

12. The power amplifier of claim 9, wherein the processor is further configured to invoke the instructions to:
    set a D+/D− connection state and send the D+/D− connection state to the device, wherein the D+/D− connection state is configured to trigger a device of a second type to feedback the recognition information.

13. The power amplifier of claim 12, wherein the instructions to determine the type of the device according to the recognition information acquired further comprise instructions to:

determine that the device is a device of the second type when the recognition information fed back by the device according to the D+/D− connection state is received.

14. The power amplifier of claim 13, wherein the processor is further configured to invoke the instructions to:
   trigger the device to send a charging request to the power amplifier according to the D+/D− connection state; and
   receive the charging request sent by the device.

15. A method for outputting a charging current for a device, comprising:
   providing a power amplifier with recognition information of the device when the device is connected with the power amplifier;
   receiving state recognition information sent by the power amplifier;
   providing the power amplifier with communication information, whereby the power amplifier selects a current to output to the device according to the communication information; wherein, the communication information comprises music lists, picture information, or video information displayed on the device; and
   receiving the output current provided by the power amplifier and charging according to the output current.

16. The method of claim 15, further comprising:
   before providing the power amplifier with the recognition information, receiving an analog level value sent by the power amplifier, wherein the analog level value is configured to trigger a device of a first type to feed back the recognition information.

17. The method of claim 15, further comprising:
   before providing the power amplifier with the recognition information, receiving a D+/D− connection state sent by the power amplifier, wherein the D+/D− connection state is configured to trigger a device of a second type to feed back the recognition information.

* * * * *